(12) United States Patent
Son et al.

(10) Patent No.: US 12,453,131 B2
(45) Date of Patent: Oct. 21, 2025

(54) ELECTRONIC DEVICE INCLUDING HETEROGENEOUS SINGLECRYSTAL TRANSITION METAL OXIDE LAYER DISPOSED ON SUBSTRATE, AND METHOD FOR MANUFACTURING THE SAME

(71) Applicant: POSTECH Research and Business Development Foundation, Pohang-si (KR)

(72) Inventors: Junwoo Son, Pohang-si (KR); Yunkyu Park, Pohang-si (KR); DongKyu Lee, Pohang-si (KR); Si-Young Choi, Pohang-si (KR); Hyeji Sim, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 531 days.

(21) Appl. No.: 17/844,873

(22) Filed: Jun. 21, 2022

(65) Prior Publication Data

US 2022/0416083 A1    Dec. 29, 2022

(30) Foreign Application Priority Data

Jun. 23, 2021 (KR) .................. 10-2021-0081447
Jun. 15, 2022 (KR) .................. 10-2022-0072964

(51) Int. Cl.
*H10D 30/67* (2025.01)
*H01L 21/02* (2006.01)
(Continued)

(52) U.S. Cl.
CPC ... *H10D 30/6755* (2025.01); *H01L 21/02565* (2013.01); *H01L 21/02639* (2013.01); *H10D 62/405* (2025.01); *H10D 62/80* (2025.01)

(58) Field of Classification Search
CPC ......... H01L 21/02381; H01L 21/02433; H01L 21/02483; H01L 21/02488;
(Continued)

(56) References Cited

U.S. PATENT DOCUMENTS 8,609,553 B2   12/2013   Huang et al.
10,396,211 B2   8/2019   Karpov et al.
(Continued)

FOREIGN PATENT DOCUMENTS

| KR | 20050106391 | 11/2005 |
| KR | 10-2013-0119466 | 10/2013 |
| KR | 20180033581 | 4/2018 |

OTHER PUBLICATIONS

Bowen Zhang et al., "High Yield Transfer of Clean Large-Area Epitaxial Oxide Thin Films", Nano-Micro Letters, vol. 13, Article No. 39 (2021), Jan. 4, 2021.
(Continued)

*Primary Examiner* — Shaun M Campbell
(74) *Attorney, Agent, or Firm* — LEX IP MEISTER, PLLC

(57) ABSTRACT

Provided is an electronic device including a semiconductor substrate, a single-crystal first transition metal oxide layer on the semiconductor substrate, and a single-crystal second transition metal oxide layer spaced apart from the semiconductor substrate with the single-crystal first transition metal oxide layer interposed therebetween. The first transition metal oxide layer and the second transition metal oxide layer are in contact with each other. The semiconductor substrate, the first transition metal oxide layer, and the second transition metal oxide layer include different materials from each other. The first transition metal oxide layer and the second transition metal oxide layer have the same crystal direction.

11 Claims, 10 Drawing Sheets

(51) Int. Cl.
  *H10D 62/40* (2025.01)
  *H10D 62/80* (2025.01)

(58) Field of Classification Search
  CPC ......... H01L 21/02502; H01L 21/02565; H01L 21/02639; H10D 30/6755; H10D 62/405; H10D 62/80; H10N 99/03
  See application file for complete search history.

(56) References Cited

U.S. PATENT DOCUMENTS

| | | | | |
|---|---|---|---|---|
| 2005/0213282 | A1* | 9/2005 | Kondo | H10N 30/079 257/E29.164 |
| 2011/0151639 | A1* | 6/2011 | Lim | H10D 1/68 257/E21.011 |
| 2012/0202356 | A1* | 8/2012 | Huang | H10B 12/00 438/785 |
| 2014/0266391 | A1* | 9/2014 | Parkin | H10N 99/03 327/365 |
| 2018/0122910 | A1* | 5/2018 | Eom | H01L 21/02565 |
| 2018/0226509 | A1* | 8/2018 | Karpov | H10N 70/826 |
| 2021/0317596 | A1* | 10/2021 | Son | H10D 62/81 |

OTHER PUBLICATIONS

Maurer, PA, "Etching Vanadium Oxide", IBM Technical Disclosure Bulletin TDB 07-77 p. 780, Jul. 1, 1977.

Y. Muraoka et al., "Meta—-insulator transition of VO2 thin films grown on TiO2 (001) and (110) substrates", Applied Physics Letters, vol. 80, No. 4, Jan. 2002.

Ke Fan et al., "Selectively Etching Vanadium Oxide to Modulate Surface Vacancies of Unary Metal-Based Electrocatalysts for High-Performance Water Oxidation", Adv. Energy Mater., vol. 10, Issue5, Dec. 2019.

Jian-Hong Lee et al., "Fabrication of Three-Dimensionally Structured Titanium Oxide Thin Films by Transfer Printing", J. Am. Ceram. Soc., 95 [1] 165-169 (2012), Oct. 2011.

\* cited by examiner

ELECTRONIC DEVICE INCLUDING HETEROGENEOUS SINGLECRYSTAL TRANSITION METAL OXIDE LAYER DISPOSED ON SUBSTRATE, AND METHOD FOR MANUFACTURING THE SAME

CROSS-REFERENCE TO RELATED APPLICATIONS

This U.S. non-provisional patent application claims priority under 35 U.S.C. § 119 of Korean Patent Application Nos. 10-2021-0081447, filed on Jun. 23, 2021, and 10-2021-0081447, filed on Jun. 15, 2022, the entire contents of which are hereby incorporated by reference.

BACKGROUND

The present disclosure herein provides an electronic device including a heterogeneous single-crystal transition metal oxide layer disposed on a substrate, and a method for manufacturing the same.

There have been quite a number of studies conducted on the formation of a single-crystal transition metal oxide layer on any substrate. Due to metal-insulator transition, high electron mobility, and ferroelectricity thereof, the single-crystal transition metal oxide layer may be used in an electronic apparatus and an optical apparatus. Although an epitaxy growth method has been studied as a method for forming a single-crystal oxide layer on a substrate, the epitaxy growth method may be limited when the lattice mismatch between the substrate and the oxide layer is large.

SUMMARY

The present disclosure provides a structure of an electronic device including a heterogeneous single-crystal transition metal oxide layer on a substrate.

The present disclosure also provides a method for forming a heterogeneous transition metal oxide layer in which single-crystal growth is difficult due to a difference in lattice constant with a substrate.

An embodiment of the inventive concept provides an electronic device including a semiconductor substrate, a single-crystal first transition metal oxide layer on the semiconductor substrate, and a single-crystal second transition metal oxide layer spaced apart from the semiconductor substrate with the single-crystal first transition metal oxide layer interposed therebetween, wherein the first and second transition metal oxide layers are in contact with each other, the semiconductor substrate, the first transition metal oxide layer, and the second transition metal oxide layer include different materials from each other, and the first transition metal oxide layer and the second transition metal oxide layer have the same crystal direction.

In an embodiment, the first transition metal oxide layer and the second transition metal oxide layer may each have a different crystal direction from the crystal direction of the semiconductor substrate.

In an embodiment, the first transition metal oxide layer may include a rutile-phased $TiO_2$ thin film, and the second transition metal oxide layer may include a rutile-phased $VO_2$ thin film.

In an embodiment, the first transition metal oxide layer may include a rutile-phased $TiO_2$ thin film, and the second transition metal oxide layer may include a rutile-phased $RuO_2$ thin film.

In an embodiment, the semiconductor substrate and the first transition metal oxide layer may be in contact with each other.

In an embodiment, the electronic device may further include an oxide film interposed between the first transition metal oxide layer and the semiconductor substrate, wherein the first transition metal oxide layer may be in contact with the oxide film.

In an embodiment, the semiconductor substrate may be a silicon substrate, and the oxide film may be a silicon oxide film, wherein the semiconductor substrate and the oxide film may be in contact with each other.

In an embodiment, the semiconductor substrate may have the crystal direction of (100), and the first transition metal oxide layer and the second transition metal oxide layer may have the crystal direction of (001).

In an embodiment, the lattice mismatch between the second transition metal oxide layer and the semiconductor substrate may be 10% or greater.

In an embodiment, the second transition metal oxide layer may be etched under weak acid conditions.

In an embodiment, the electronic device may further include a gate electrode on the second transition metal oxide layer, and a source electrode and a drain electrode spaced apart from each other with the gate electrode interposed therebetween.

In an embodiment, the source electrode and the drain electrode may be in contact with the second transition metal oxide layer.

In an embodiment, the source electrode and the drain electrode may be spaced apart from the second transition metal oxide layer, and the semiconductor substrate may include, in an upper portion thereof, a first doped region and a second doped region disposed at both sides with respect to the gate electrode, wherein the source electrode may be connected to the first doped region, and the drain electrode may be connected to the second doped region.

In an embodiment, the electronic device may further include a gate electrode, a first source electrode, a second source electrode, and a drain electrode on the semiconductor substrate, wherein the first and second source electrodes may be spaced apart from the drain electrode with the gate electrode interposed therebetween, and the semiconductor substrate may include, in an upper portion thereof, a first doped region and a second doped region disposed at both sides with respect to the gate electrode, wherein the second transition metal oxide layer may be connected in series to the first source electrode and the second source electrode therebetween, the first source electrode may be electrically connected to a ground power source, the second source electrode may be electrically connected to the first doped region, and the drain electrode may be electrically connected to the second doped region.

In an embodiment, the second transition metal oxide layer may have a thickness of 5 to 10 nm.

In an embodiment of the inventive concept, an electronic device includes a substrate, a first transition metal oxide layer on the substrate, and a single-crystal second transition metal oxide layer spaced apart from the substrate with the first transition metal oxide layer interposed therebetween, wherein the substrate, the first transition metal oxide layer, and the second transition metal oxide layer include different materials from each other, the second transition metal oxide layer is in contact with the first transition metal oxide layer, and the second transition metal oxide layer has the crystal direction of (001).

In an embodiment, the substrate and the first transition metal oxide layer may have conductivity, and the second transition metal oxide layer may have insulating properties.

In an embodiment, the substrate may include $SrTiO_3$, the first transition metal oxide layer may include $SrRuO_3$, and the second transition metal oxide layer may include rutile $TiO_2$.

In an embodiment, the substrate may include silicon, the first transition metal oxide layer may include a rutile $TiO_2$, and the second transition metal oxide layer may include any one selected between rutile $VO_2$ and rutile $RuO_2$.

In an embodiment of the inventive concept, a method for manufacturing an electronic device includes preparing a host substrate including a first transition metal oxide, preparing a sacrificial layer including a second transition metal oxide on the host substrate, preparing a transfer layer including the first transition metal oxide on the sacrificial layer, selectively removing the sacrificial layer, transferring the transfer layer on a target substrate, and epitaxially growing a single-crystal target layer including the second transition metal oxide on the transfer layer, wherein the target substrate and the second transition metal oxide include different materials from each other, and the selectively removing of the sacrificial layer includes an etching process using a weak acid.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, in order to describe the present invention in more detail, embodiments according to the present invention will be described in more detail with reference to the accompanying drawings.

FIG. 1 to FIG. 4 are cross-sectional views schematically showing a method for forming a heterogeneous single-crystal transition metal oxide layer disposed on a substrate.

Figure 1:
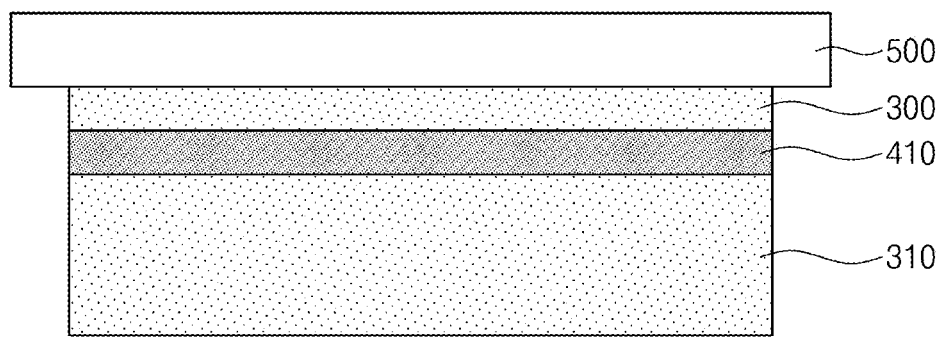
FIG. 1 to FIG. 4 are cross-sectional views schematically showing a method for forming a heterogeneous single-crystal transition metal oxide layer disposed on a substrate.

Referring to FIG. 1, a host substrate 310 may be prepared. The host substrate 310 may include a first metal oxide. As an example, the host substrate 310 may be a rutile-phased titanium dioxide ($TiO_2$) layer having the crystal direction of a single crystal (001).

On one surface of the host substrate 310, a sacrificial layer 410 may be formed. The sacrificial layer 410 may be formed epitaxially on the host substrate 310 in the (001) direction. The sacrificial layer 410 may include a second metal oxide. The second metal oxide may be a metal oxide different from the first metal oxide. The second metal oxide may be a material having etch selectivity with respect to the first metal oxide. As an example, the sacrificial layer 410 may be formed by a laser deposition method. The sacrificial layer 410 may be formed to a thickness of several tens of nanometers. As an example, the sacrificial layer 410 may include a single-crystal rutile-phased vanadium dioxide ($VO_2$).

A transfer layer 300 may be formed on the sacrificial layer 410. In the present disclosure, the transfer layer 300 may also be referred to as a nano membrane (NB). The transfer layer 300 may be grown epitaxially on the sacrificial layer 410 in the (001) direction. The transfer layer 300 may be formed to various thicknesses (ex: 10 nm to 70 nm).

The transfer layer 300 may include the first metal oxide as the host substrate 310 does. As an example, the transfer layer 300 may be a rutile-phased titanium dioxide ($TiO_2$) layer having the crystal direction of the single crystal (001).

Alternatively, the transfer layer 300 may include a third metal oxide different from the host substrate 310 does. The third metal oxide may be a material having etch selectivity with respect to the second metal oxide. As an example, the transfer layer 300 may be a rutile-phased ruthenium dioxide ($RuO_2$) layer having the crystal direction of the single crystal (001). As an example, the transfer layer 300 may be formed by a laser deposition method.

On an upper surface of the transfer layer 300, a support layer 500 may be formed. The support layer 500 may be an adhesive tape or a polymer layer. As an example, the support layer 500 may include PDMS.

Figure 2:
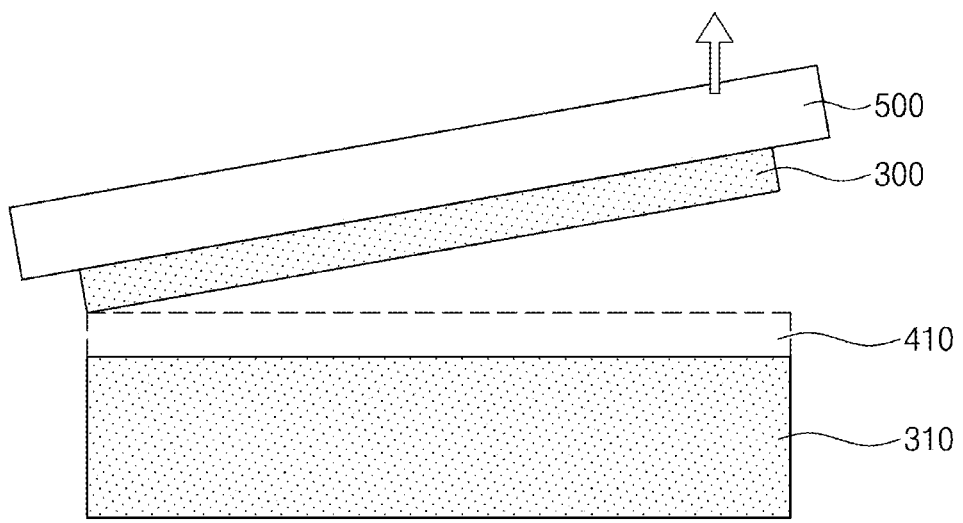

Referring to FIG. 2, the sacrificial layer 410 may be selectively removed. A removing process of the sacrificial layer may be a wet etching process using a weak acid. Specifically, the sacrificial layer 410 may be removed by being dissolved by a weak acid. The sacrificial layer 410 may be etched from an edge thereof. Since the sacrificial layer 300 covers an upper surface of the sacrificial layer 410, etching may be performed from an exposed side surface of the sacrificial layer 410.

As an example, $VO_2$ of a three-dimensional structure constituting the sacrificial layer 410 may be oxidized to $V_2O_5$ of a two-dimensional layered structure.

For example, the weak acid may be $H_2O_2$. The acidity (ph) of the weak acid may be approximately 5.3 or less.

During the etching process, the host substrate 310 and the transfer layer 300 may not be removed, and may not be damaged. The transfer layer 300 may be removed from the host substrate 310 by applying an external force to the support layer 500.

According to some embodiments, after a process of removing the sacrificial layer 410, a watching step may be performed on the surface of the sacrificial layer 300. Residues which may remain on the transfer layer 300 may be removed by the washing process.

Figure 3:
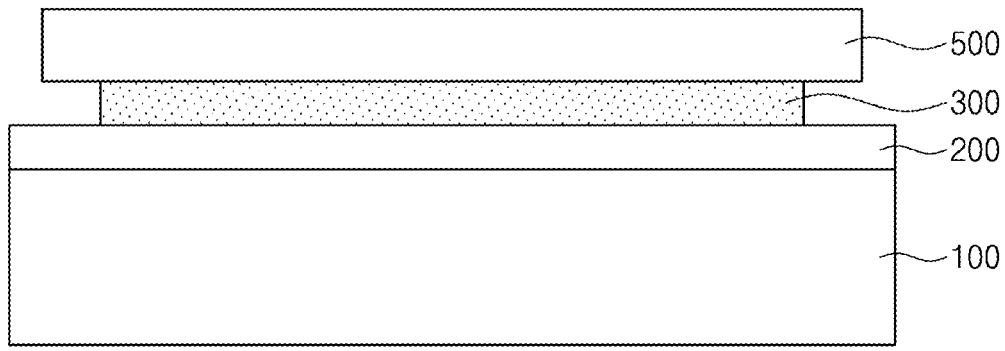

Referring to FIG. 3, the transfer layer 300 may be transferred onto the target substrate 100. The target substrate 100 may be any substrate among a metal substrate, a flexible polymer substrate, and a semiconductor substrate. As an example, the target substrate 100 may be a silicon (Si) substrate. As another example, the target substrate 100 may be another semiconductor substrate such as a silicon on insulator (SOI) substrate, a germanium (Ge) substrate, and the like. The target substrate 100 may include a material different from the material of the transfer layer 300.

On an upper surface of the target substrate 100, an oxide film 200 may be disposed. The oxide film 200 may be formed as a result of natural oxidation, thermal oxidation, or the like of the surface of the target substrate 100. As an example, when the target substrate 100 is a silicon substrate, the oxide film may be a silicon film. The transfer layer 300 may be disposed to be in contact with the oxide film 200. According to some other embodiments, the oxide film 200 may be removed through an etching process and the like before the transfer of the transfer layer 300. Alternatively, by adjusting the formation environment and maintenance environment of the target substrate 100, it is possible to prevent the oxide film 200 from being formed naturally.

Figure 4:
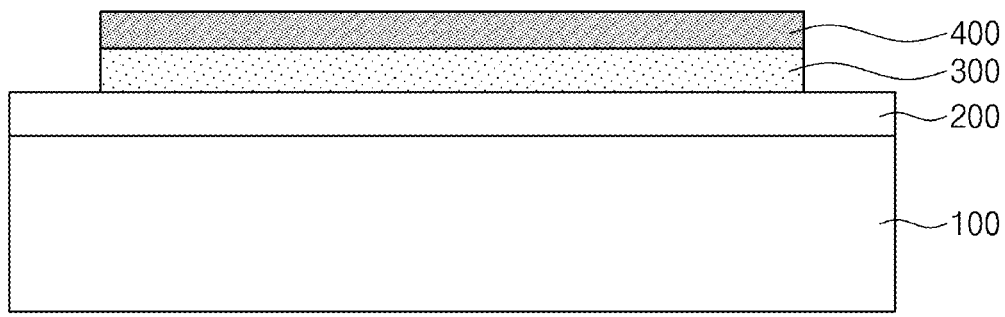

Referring to FIG. 3 and FIG. 4, the transfer layer 300 may be heated. As an example, the transfer layer 300 may be heated to a temperature of approximately 60° C. When the transfer layer 300 is heated, the coupling force between the oxide film 200 and the transfer layer 300 increases, and the coupling force between the transfer layer 300 and the support layer 500 may decrease. The support layer 500 may be separated from the transfer layer 300 by external force.

Thereafter, a target layer 400 may be formed by using the transfer layer 300 as a seed layer. The transfer layer 300 may be used as a template in which the target layer 400 is formed. The target layer 400 may be formed by epitaxy growth on the transfer layer 300. As an example, the target layer 400 may be formed by pulsed laser deposition (PLD).

The target layer 400 may include a material different from the material of the transfer layer 300 and from the material of the target substrate 100. As an example, the target layer 400 may be a rutile-phased vanadium dioxide ($VO_2$) layer having the crystal direction of the single crystal (100). As another example, the target layer 400 may be a rutile-phased ruthenium dioxide ($RuO_2$) layer having the crystal direction of the single crystal (100).

According to the inventive concept, the target layer 400 may be a metal oxide layer which is difficult to be epitaxially formed as a single crystal on the target substrate 100. When the lattice mismatch is within 10%, it is known that epitaxial growth is possible. Referring to Table 1 below, it can be seen that it is difficult to epitaxially form rutile-phased vanadium dioxide ($VO_2$), or rutile-phased ruthenium dioxide ($RuO_2$) on cubic-phased silicon (Si). On the contrary, it is possible to epitaxially form rutile-phased vanadium dioxide ($VO_2$), or rutile-phased ruthenium dioxide ($RuO_2$) as a single crystal on rutile-phased titanium dioxide ($TiO_2$).

TABLE 1

| Material (Crystal structure) | In-plane lattice constant | Lattice mismatch (Rutile/Si) |
| --- | --- | --- |
| Si(Cubic) | 5.43Å | — |
| $SnO_2$(rutile) | 4.83Å | 11% |
| $TiO_2$(rutile) | 4.59Å | 15% |
| $VO_2$(rutile) | 4.54Å | 16% |
| $RuO_2$(rutile) | 4.49Å | 17% |

Previously, there were many studies conducted to form a single-crystal oxide layer on a silicon substrate. In the case of one conventional technique, when a single-crystal oxide layer is formed on a silicon substrate, a large amount of defects are formed due to lattice mismatch. In the case of another conventional technique, when transferring a single-crystal oxide layer onto a silicon substrate, a transfer layer (a single-crystal oxide layer) is first released from a host substrate by using a method such as laser lift off. A physical process such as laser lift off causes structural damage to a single-crystal oxide layer. In the case of yet another conventional technique, a graphene layer is inserted between a single-crystal oxide layer and a host substrate. However, since the graphene layer is vulnerable to oxygen, it is difficult to form a high-quality single crystal oxide layer by forming a graphene oxide layer.

On the other hand, according to the inventive concept, due to a $TiO_2$ transfer layer having the same crystal structure as the crystal structure of a $VO_2$ target layer and a small lattice mismatch with the $VO_2$ target layer on a silicon substrate, it is possible to epitaxially grow $VO_2$. The $TiO_2$ transfer layer may prevent a subsequent reaction between the $VO_2$ target layer and the silicon substrate, and thus, may also prevent interfacial defects. As a result, it has been confirmed that even when grown to be ultra-thin (5 to 10 nm), $VO_2$ has good high resistance modulation ($\Delta\rho/\rho$) properties on the Si substrate.

According to an embodiment of the present invention, the transfer layer 300 may be a rutile-phased titanium dioxide ($TiO_2$) layer having the crystal direction of the single crystal (001), and the target layer 400 may be a rutile-phased vanadium dioxide ($VO_2$) layer having the crystal direction of the single crystal (001). A single-crystal vanadium dioxide ($VO_2$) layer has good metal-insulator transition (MIT) properties, and thus, may be applied to a switching device.

According to another embodiment, the transfer layer 300 may be a rutile-phased titanium dioxide ($TiO_2$) layer having the crystal direction of the single crystal (001), and the target layer 400 may be a rutile-phased ruthenium dioxide ($RuO_2$) layer having the crystal direction of the single crystal (001). The rutile-phased titanium dioxide ($TiO_2$) layer has high dielectric properties, and the rutile-phased ruthenium dioxide ($RuO_2$) layer may be used as an electrode. The target substrate 100 also serves as an electrode, and thus, may be applied to charge storage device such as a capacitor.

Figure 5:
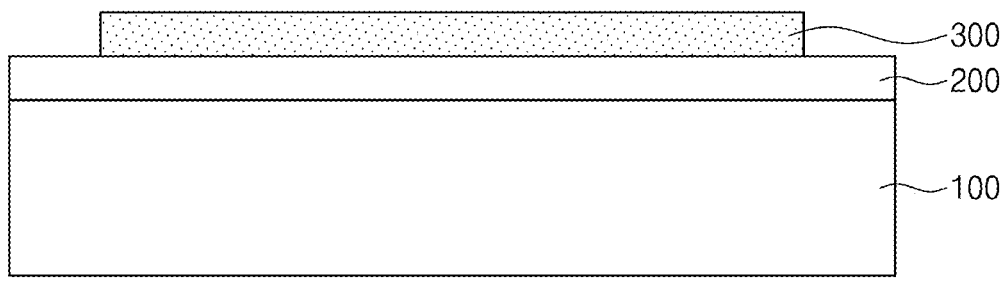
FIG. 5 is a cross-sectional view showing a single-crystal transition metal oxide layer disposed on a substrate.

FIG. 5 is a cross-sectional view showing a single-crystal transition metal oxide layer disposed on a substrate. Except for those to be described below, descriptions which are the same as those described with reference to FIG. 1 to FIG. 4 will be omitted.

Referring to FIG. 5, according to some embodiments, the transfer layer 300 may be a rutile-phased ruthenium dioxide ($RuO_2$) layer. On the rutile-phased ruthenium dioxide ($RuO_2$) layer, the target layer 400 as shown in FIG. 4 may not be formed.

According to other embodiments, the target substrate 100 may be a strontium titanate (STO: $SrTiO_3$) substrate. The oxide layer 200 may include a material different from the material of the target substrate 100, not a natural oxide film. As an example, the oxide film 200 may be a strontium ruthenium oxide (STO: $SrTiO_3$). The transfer layer 300 may be a single-crystal titanium dioxide ($TiO_2$) layer.

Figure 6:
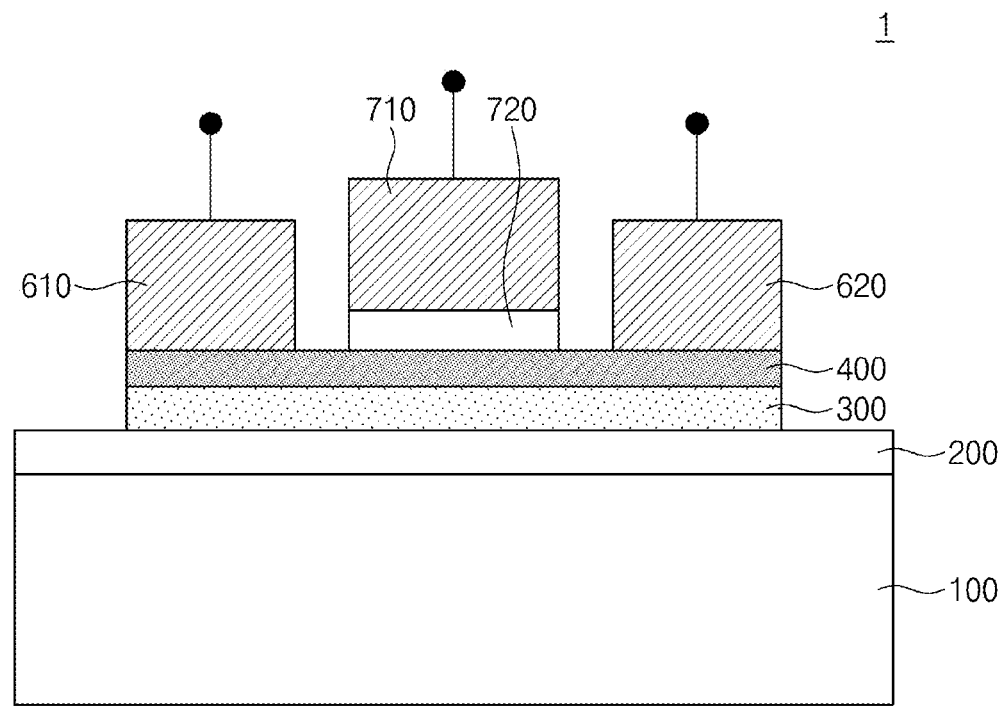
FIG. 6 relates to an electronic device including a heterogeneous single-crystal transition metal oxide layer disposed on a substrate according to embodiments of the present invention.

FIG. 6 relates to an electronic device including a heterogeneous single-crystal transition metal oxide layer disposed on a substrate according to embodiments of the present invention. Except for those to be described below, descriptions which are the same as those given above will be omitted.

Referring to FIG. 6, an electronic device 1 may be provided. The electronic device 1 may be a Mott transistor. The electronic device 1 may include the semiconductor substrate 100, the oxide film 200, the transfer layer 300, the target layer 400, a gate insulation film 720, a gate electrode 710, a source electrode 610, and a drain electrode 620. According to some embodiments, the oxide film 200 may be omitted.

The gate electrode 710, the source electrode 610, and the drain electrode 620 may be disposed on the target layer 400. The source electrode 610 and the drain electrode 620 may be spaced apart from each other with the gate electrode 710 interposed therebetween. The gate insulation film 720 may be interposed between the gate electrode 710 and the target layer 400. The target layer 400 may function as a channel of a transistor. The gate electrode 710, the source electrode 610, and the drain electrode 620 may each include a conductive material such as a metal. The transfer layer 300 may be, for example, a rutile-phased titanium dioxide ($TiO_2$) layer having the crystal direction of the single crystal (001), and the target layer 400 may be a rutile-phased vanadium dioxide ($VO_2$) layer having the crystal direction of the single crystal (001).

Figure 7:
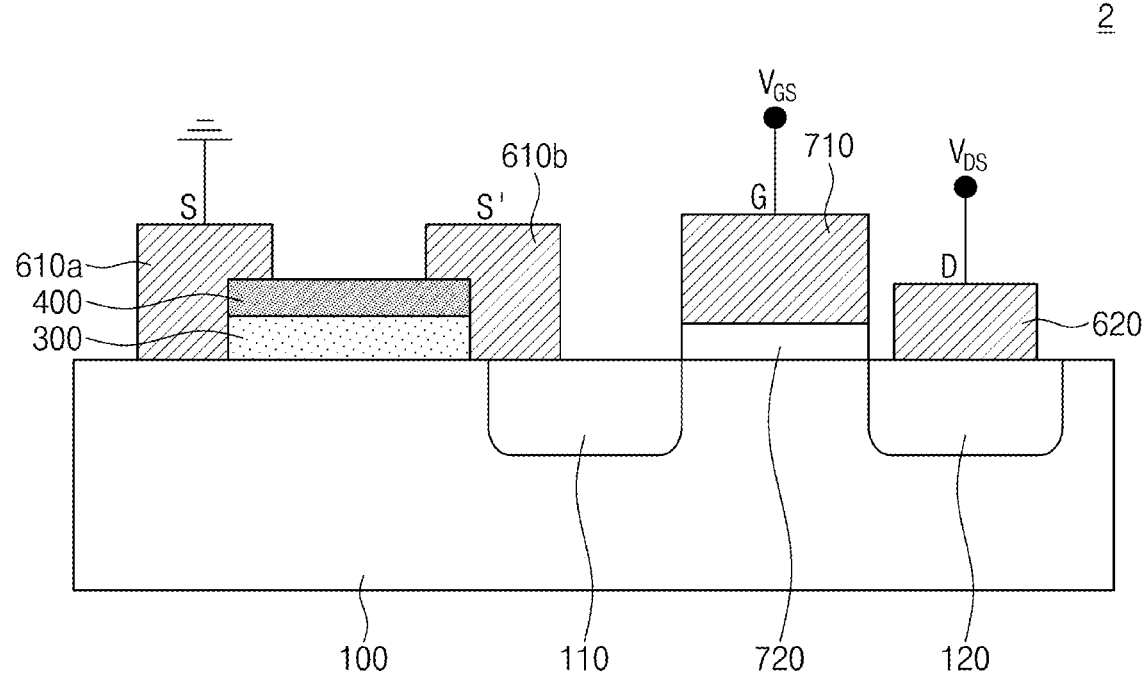
FIG. 7 relates to an electronic device including a heterogeneous single-crystal transition metal oxide layer disposed on a substrate according to some embodiments.
Figure 8:
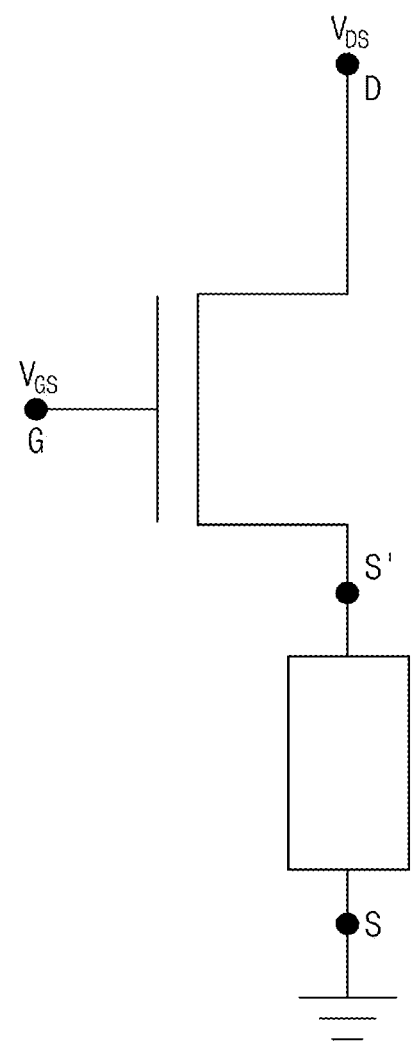
FIG. 8 is a circuit diagram of FIG. 7.

FIG. 7 relates to an electronic device including a heterogeneous single-crystal transition metal oxide layer disposed on a substrate according to some embodiments. FIG. 8 is a circuit diagram of FIG. 7. Except for those to be described below, descriptions which are the same as those given above will be omitted.

Referring to FIG. 7 and FIG. 8, an electronic device 2 may be provided. The electronic device 2 may be a hyper-field effect transistor (FET). The electronic device 2 may include the semiconductor substrate 100, the gate electrode 710, the gate insulation film 720, a first source electrode 610a, a second source electrode 610b, the drain electrode 620, the transfer layer 300, and the target layer 400.

The semiconductor substrate 100 may be a first conductivity type silicon substrate. As an example, the semiconductor substrate 100 may be a p-type silicon substrate. The semiconductor substrate 100 may include, in an upper portion thereof, a first doped region 110 and a second the doped region 120, which are doped with impurities. The first and second doped regions 110 and 120 may be regions doped with a second conductivity type. As an example, the first doped region 110 and the second doped region 120 may each be an n+ doped region.

The gate electrode 710 may be disposed on the semiconductor substrate 100 with the first doped region 110 and the second doped region 120 disposed at both sides. The gate insulation film 720 may be interposed between the gate electrode 710 and the semiconductor substrate 100.

The first doped region 110 of the semiconductor substrate 100 is electrically connected to the second source electrode 610b, and the second doped region 120 thereof may be electrically connected to the drain electrode 620. The transfer layer 300 may be connected in series to the first source electrode 610a and the second source electrode 610b therebetween. The first source electrode 610a may be electrically connected a ground power source.

The transfer layer 300 may be a rutile-phased titanium dioxide ($TiO_2$) layer having the crystal direction of the single crystal (001), and the target layer 400 may be a rutile-phased vanadium dioxide ($VO_2$) layer having the crystal direction of the single crystal (001). A single-crystal rutile-phased vanadium dioxide ($VO_2$) layer may react to an electric current to achieve metal-insulator transition, and may reduce the resistance of a source.

Figure 9:
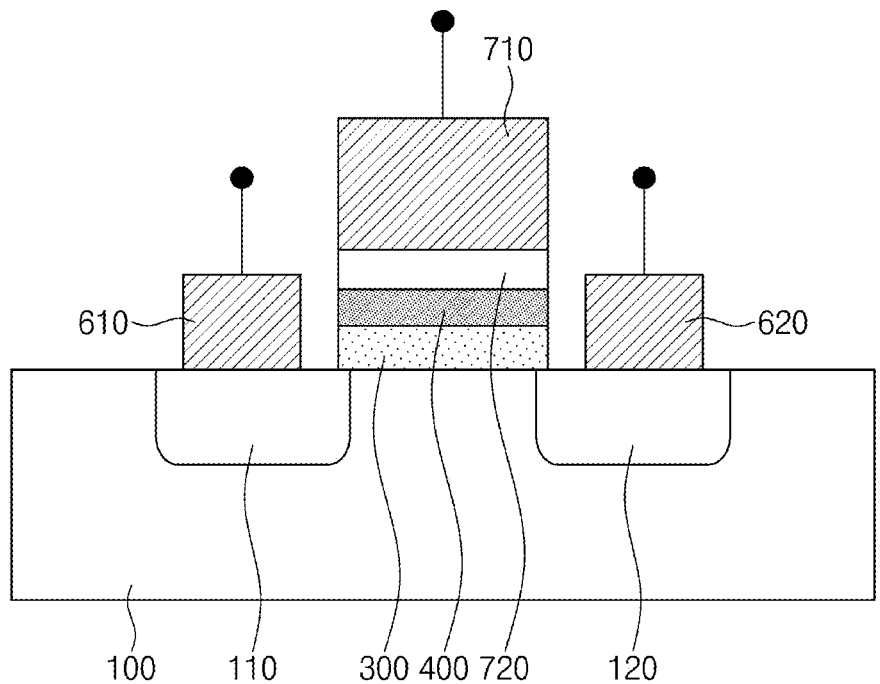
FIG. 9 relates to an electronic device including a heterogeneous single-crystal transition metal oxide layer disposed on a substrate according to some embodiments.

FIG. 9 relates to an electronic device including a heterogeneous single-crystal transition metal oxide layer disposed on a substrate according to some embodiments. Except for those to be described below, descriptions which are the same as those given above will be omitted.

Referring to FIG. 9, an electronic device 3 may be provided. The electronic device 3 may be a MOSFET. The electronic device 3 may include the semiconductor substrate 100, the gate electrode 710, the gate insulation film 720, the source electrode 610, the drain electrode 620, the transfer layer 300, and the target layer 400.

The semiconductor substrate 100 may be a first conductivity-type (ex: p−) silicon substrate. The semiconductor substrate 100 may include, in an upper portion thereof, a first doped region 110 and a second the doped region 120, which are doped with impurities. The first and second doped regions 110 and 120 may be regions doped with a second conductivity type (ex: n+).

The transfer layer 300 and the target layer 400 may be disposed vertically overlapped with a channel region of the semiconductor substrate 100. That is, the transfer layer 300 and the target layer 400 may be disposed between the gate electrode 710 and the semiconductor substrate 100.

The transfer layer 300 may be a rutile-phased titanium dioxide ($TiO_2$) layer having the crystal direction of the single crystal (001), and the target layer 400 may be a rutile-phased vanadium dioxide ($VO_2$) layer having the crystal direction of the single crystal (001). A single-crystal rutile-phased vanadium dioxide ($VO_2$) layer may react to a gate voltage to achieve metal-insulator transition, and in a channel-on state, a current flowing through a channel may increase.

Example 1

An epitaxial $VO_2$ thin film (~17 nm) was grown on a (001) $TiO_2$ single-crystal substrate (formation of a sacrificial layer). Thereafter, a $TiO_2$ nano membrane (10 to 70 nm) was grown on the $VO_2$ thin film by pulsed laser deposition (PLD) (formation of a transfer layer).

Specifically, a $TiO_2$ single-crystal substrate (Shinkosha CO., LTD) having a maximum side size of 5 mm×5 mm of (001) was first placed in a PLD chamber, and then exhaustion was performed at a base pressure of approximately $1\times10^{-6}$ Torr.

The formation of the $VO_2$ thin film concentrated a KrF excimer laser (Coherent Complex Pro 102F, $\lambda=248$ nm) on a rotating $V_2O_5$ target with a fluence of 1 J/cm$^2$ and a repetition rate of 1 Hz. The growth of the $VO_2$ thin film was adjusted to induce steep metal-insulator transition near room temperature while fixing $P_{O2}$ to 15 mTorr and $T_g$ to 300° C.

The formation of the $TiO_2$ nano membrane concentrated a KrF excimer laser (Coherent Complex Pro 102F, $\lambda=248$ nm) on a rotating $TiO_2$ target with a fluence of 1 J/cm$^2$ and a repetition rate of 1 Hz. The $TiO_2$ nano membrane was formed on the VO$_2$ thin film under the conditions of P$_{O2}$=28 mTorr and T$_g$=300° C., and then cooled to room temperature at a rate of 20° C./min.

In order to separate the TiO$_2$ nano membrane, the surface of the TiO$_2$ nano membrane was attached to a solid support layer (e.g., polydimethylsiloxane (PDMS), high-temperature peel tape (Haeun Chemtec, RP70N5)) (attachment of a support layer).

The VO$_2$ thin film was impregnated in a dilute 10% H$_2$O$_2$ solution at room temperature until the VO$_2$ thin film was completely dissolved. The dilute 10% H$_2$O$_2$ solution was prepared by mixing 50 ml of 35% H$_2$O$_2$ and 150 ml of H$_2$O. After the VO$_2$ thin film is dissolved, H$_2$O residues remaining on the surface of the TiO$_2$ nano membrane was evaporated (the removal of a sacrificial layer).

The TiO$_2$ nano membrane was attached to a silicon substrate coated with an oxide, and then heated to 60 to 80° C. for 10 minutes (the transfer of a transfer layer). Lastly, after the support layer was slowly peeled off, the TiO$_2$ nano membrane remained on the silicon substrate.

Thereafter, under the same growth conditions as those for forming the VO$_2$ thin film on the (001) TiO$_2$ nano membrane, an epitaxy VO$_2$ thin film was grown on the TiO$_2$ nano membrane (formation of a target layer).

Example 2

In Example 1, instead of forming a VO$_2$ thin film as a target layer, a RuO$_2$ thin film was formed as a target layer. When forming the RuO$_2$ thin film, pulsed laser deposition (PLD) was used using RuO$_2$ as a target.

Example 3

In Example 1, a RuO$_2$ nano membrane was formed instead of the TiO$_2$ nano membrane. After transferring the RuO$_2$ nano membrane onto a silicon substrate, a VO$_2$ thin film was not formed.

Example 4

In Example 1, the TiO$_2$ nano membrane was transferred onto a SRO/STO substrate. No additional metal oxide was formed on the TiO$_2$ nano membrane.

Comparative Example

A VO$_2$ thin film was directly grown on a silicon substrate.

Test Example 1: Identification of Crystallinity of Each Layer During Manufacturing Process According to Example 1

Figure 10:
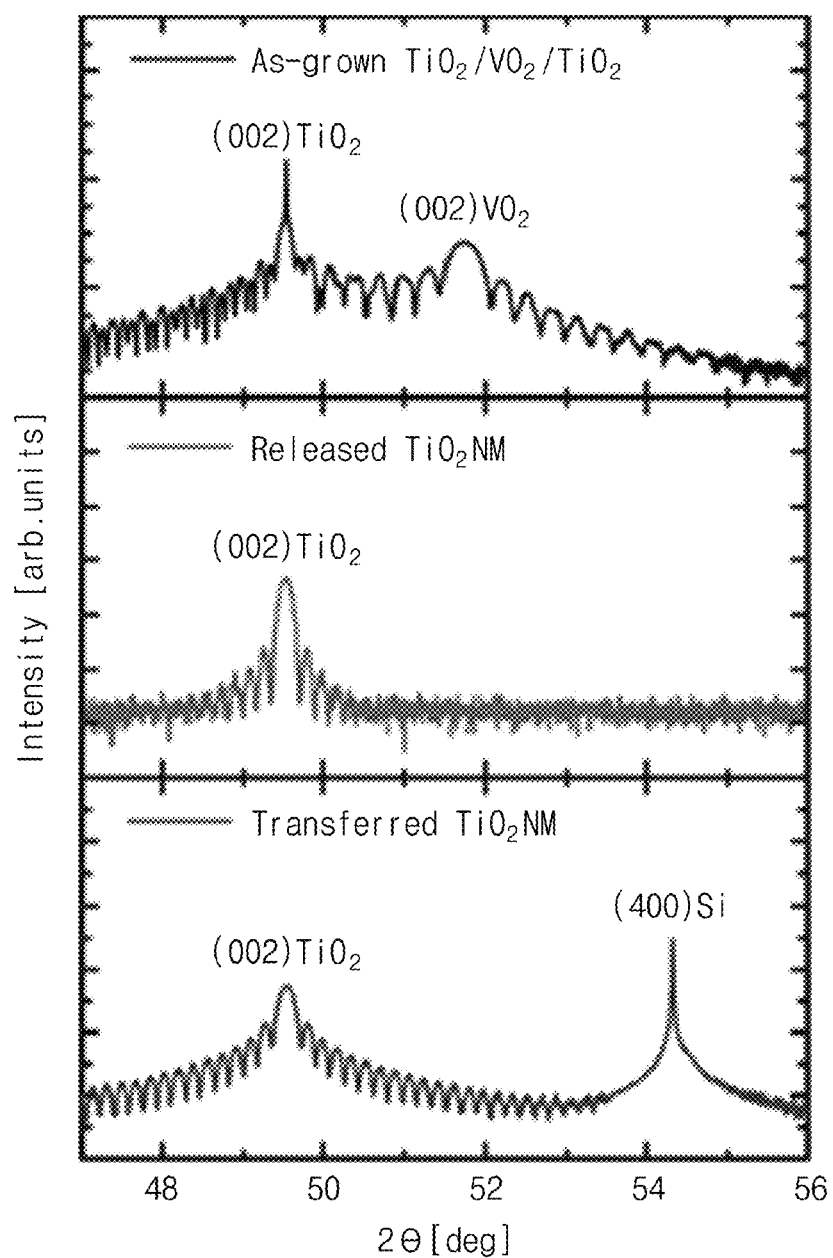
FIG. 10 shows a symmetric 2θ-ω scan of each layer during a process of forming a single-crystal transition metal oxide layer disposed on a substrate according to Example 1.

FIG. 10 shows a symmetric 2θ-ω scan of each layer during a process of forming a single-crystal transition metal oxide layer disposed on a substrate according to Example 1.

Referring to FIG. 10, a rutile TiO$_2$ transfer layer and a VO$_2$ sacrificial layer were sequentially formed on a TiO$_2$ host substrate, and then a symmetric 2θ-ω scan was performed through X-ray scattering. As a result, at 2θ=49.54°, a (002) plane of the rutile TiO$_2$ transfer layer and a (002) peak of the TiO$_2$ host substrate were observed, and at 2θ=51.75°, a peak of (002) of the VO$_2$ sacrificial layer was observed. When a symmetric 2-ω scan was performed after removing the VO$_2$ sacrificial layer using H$_2$O$_2$, even after the VO$_2$ sacrificial layer was removed, the crystallinity of the rutile TiO$_2$ transfer layer was not damaged, and no residual VO$_2$ sacrificial layer was observed. When a symmetric 2θ-ω scan was performed through x-ray scattering after disposing the TiO$_2$ transfer layer on a silicon target substrate, the (002) plane of the rutile TiO$_2$ transfer layer and a (400) peak of the Si substrate (2θ=54.32°) were simultaneously observed.

Test Example 2: Identification of Crystallinity of VO$_2$ Target Layer According to Example 1 and Comparative Example FIG. 11 shows a symmetric 2θ-ω scan of a VO$_2$ target layer formed according to Example 1 and Comparative Example.

Figure 11:
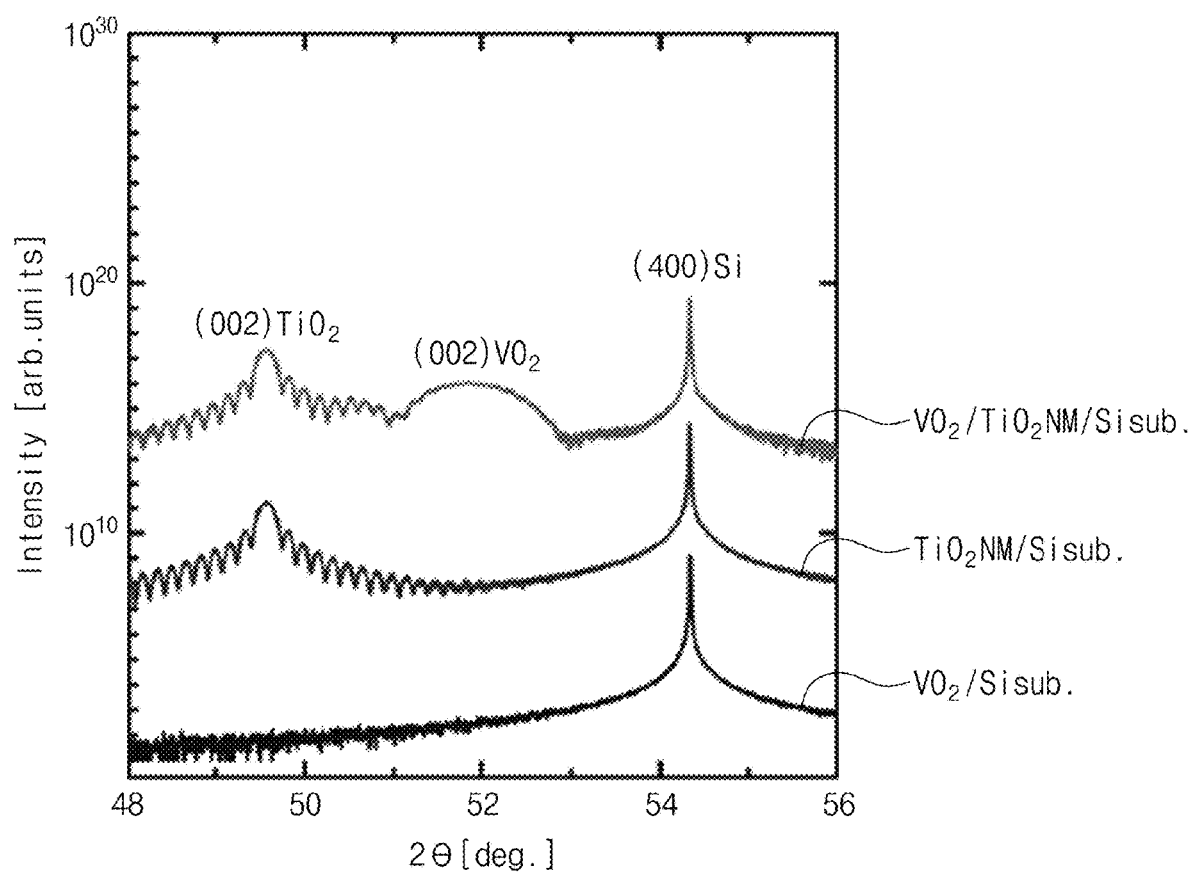
FIG. 11 shows a symmetric 2θ-ω scan of a $VO_2$ target layer formed according to Example 1 and Comparative Example.

Referring to FIG. 11, a peak of (200) was observed in the VO$_2$ target layer formed on the TiO$_2$ nano membrane (NM) according to Example 1. On the contrary, a peak of (002) of VO$_2$ was not observed in Comparative Example. As a result, it can be seen that the TiO$_2$ nano membrane, which is a single-crystal template whose lattice matches that of VO$_2$, helps VO$_2$ grow as a single crystal.

Test Example 3: Single Crystal Measurement of VO$_2$ Target Layer According to Example 1

Figure 12:
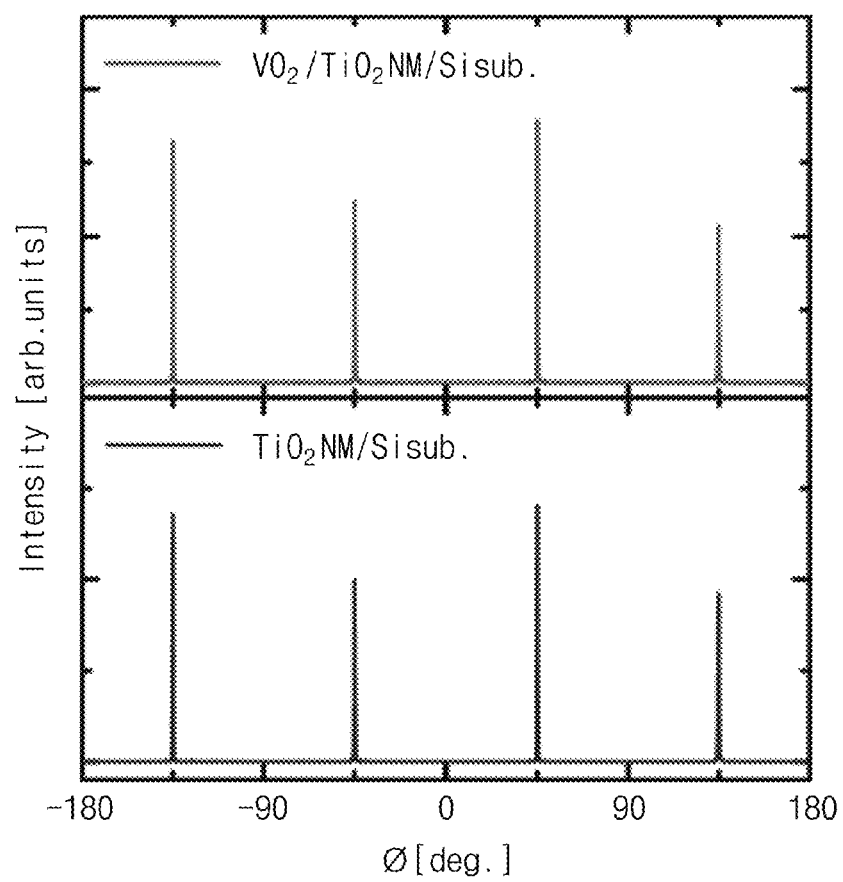
FIG. 12 shows an asymmetric ϕ scan of each layer according to Example 1.

FIG. 12 shows an asymmetric φ scan of each layer according to Example 1.

Referring to FIG. 12, the asymmetric φ scan result of a (112)$_R$ plane of a TiO$_2$ sacrificial layer (TiO$_2$ NM)/silicon substrate (Si Sub) and the asymmetric scan result of a (112)$_R$ plane of a VO$_2$ target layer/TiO$_2$ sacrificial layer (TiO$_2$ NM)/silicon substrate (Si Sub) were observed to be the same as each other. That is, it can be seen that the VO$_2$ target layer is formed as a single crystal.

Test Example 4: Measurement of Temperature-Dependent Resistivity Modulation Near Metal-Insulator Transition Temperature (T$_{MIT}$) According to Example 1 and Comparative Example 1

Figure 13:
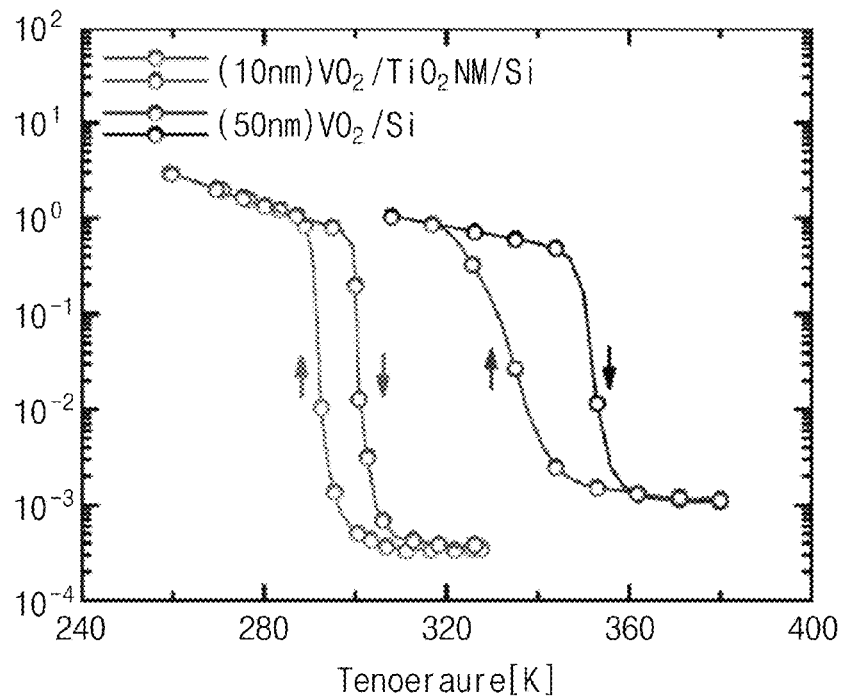
FIG. 13 shows temperature-dependent resistance modulation near a metal-insulator transition temperature ($T_{MIT}$) according to Example 1 and Comparative Example 1.

FIG. 13 shows temperature-dependent resistance modulation near a metal-insulator transition temperature (T$_{MIT}$) according to Example 1 and Comparative Example 1. Referring to FIG. 8, Example 1 (10 nm VO$_2$) had a high resistance modulation (Δρ/ρ) of 3.3×10$^3$ at approximately 296 K. It was observed that Comparative Example (50 nm VO$_2$) had a relatively ow resistance modulation (Δρ/ρ) of 5.2×10$^2$ at approximately 343 K.

Test Example 5: Measurement of Metal-Insulator Transition Properties According to Example 1 and Comparative Example 1

Figure 14:
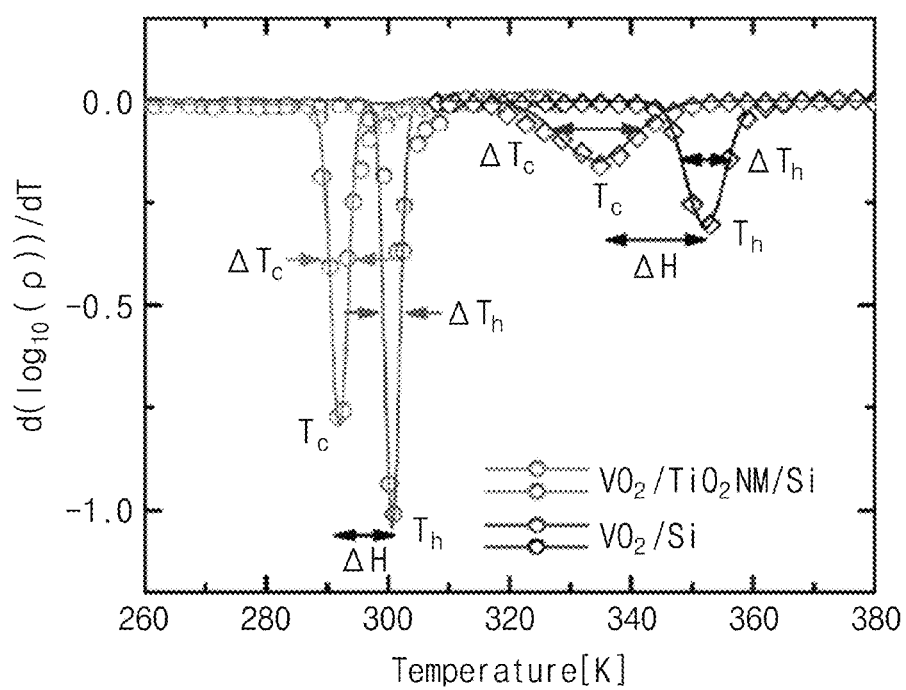
FIG. 14 shows metal-insulator transition (MIT) properties of Example1 and Comparative Example.

FIG. 14 shows metal-insulator transition (MIT) properties of Example1 and Comparative Example. Referring to FIG. 14, Example 1 showed sharper metal-insulator transition properties than those of Comparative Example. As a result, it can be seen that the VO$_2$ target layer according to Example 1 has single-crystal properties. In addition, it can be seen that the single-crystal VO$_2$ target layer of Example 1 is formed well aligned on TiO$_2$ of a single crystal.

Figure 15:
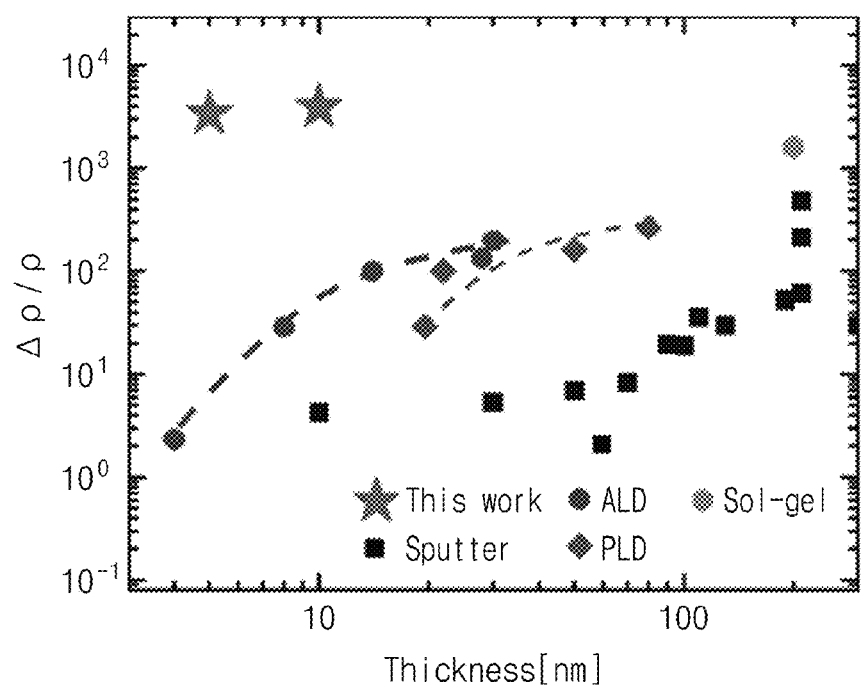
FIG. 15 shows changes in resistance modulation according to differences in manufacturing process of a $VO_2$ target layer and changes in $VO_2$ thickness.

Test Example 6: Measurement of Changes in Resistance Modulation According to Differences in Manufacturing Process of VO$_2$ Target Layer and Changes in VO$_2$ Thickness FIG. 15 shows changes in resistance modulation according to differences in manufacturing process of a VO$_2$ target layer and changes in VO$_2$ thickness.

By varying a thickness on a Si substrate, as shown in Table 2 below, a VO$_2$ film was directly formed on a silicon substrate or a silicon substrate coated with a silicon oxide using an ALD method, a PLD method, a Sol-Gel method, or a sputter method and metal-insulator transition (MIT) properties were measured. The resistance modulation (Δρ/ρ) of the VO$_2$ film formed by the ALD method, the PLD method, the Sol-Gel method, and the sputter method was not high due to reasons such as the formation of a polycrystalline VO$_2$ layer. The resistance modulation (Δρ/ρ) showed a tendency to decrease as the thickness of the VO$_2$ film decreases. When a defective interfacial layer was additionally formed between the VO$_2$ film and silicon (or the silicon oxide), and occupied a significant portion of the VO$_2$ film, the resistance modulation value further decreased. That is, when the thickness of the VO$_2$ thin film decreases, the formation of the VO$_2$ thin film directly on the silicon substrate resulted in poor metal-insulator transition properties. On the contrary, in the case of this work, due to a TiO$_2$ layer having the same crystal structure (P4$_2$/mnm) as the crystal structure of a VO$_2$ target layer and a small lattice mismatch with the VO$_2$ target layer on a Si substrate, it is possible to epitaxially grow VO$_2$. The TiO$_2$ layer may prevent a subsequent reaction between the VO$_2$ and the Si substrate, and thus, may prevent interfacial defects. As a result, it has been confirmed that even when grown to be ultra-thin (5 to 10 nm), VO$_2$ has good high resistance modulation (Δρ/ρ) properties on the Si substrate.

TABLE 2

| Method | Thickness | $T_{MIT}$ | $\rho_{T_{MIT}-15K}$ | $\rho_{T_{MIT}+15K}$ | Δρ/ρ |
|---|---|---|---|---|---|
| ALD | 4 nm | 356K | 3 | 0.9 | 2.33 |
|  | 8 nm | 340K | 0.03 | 0.001 | 29 |
|  | 14 nm | 360K | 0.003 | 0.00003 | 99 |
|  | 28 nm | 325K | 0.004 | 0.00003 | 132 |
|  | 30 nm | 355K | 6 | 0.03 | 199 |
| PLD | 80 nm | 337K | 6.4 | 0.024 | 266 |
|  | 10.5 nm | 318K | 0.6 | 0.02 | 29 |
|  | 21.91 nm | 325K | 0.4 | 0.004 | 98 |
|  | 50 nm | 340K | 0.8 | 0.005 | 150 |
| Sol-el | 200 nm | 337K | 0.016 | 0.00001 | 1 599 |
| Sputter | 210 nm | 338K | 0.32 | 0.0015 | 212.33 |
|  | 210 nm | 328K | 0.357 | 0.000735 | 484.71 |
|  | 100 nm | 336K | 0.5 | 0.025 | 18 |
|  | 300 nm | 335K | 0.6 | 0.0195 | 29.76 |
|  | 10 nm | 328K | 0.095 | 0.018 | 4.27 |
|  | 30 nm | 328K | 0.07 | 0.011 | 5.36 |
|  | 50 nm | 32SK | 0.06 | 0.0)75 | 3 |
|  | 70 nm | 325K | 0.07 | 0.0075 | 8.33 |
|  | 90 nm | 325K | 0.037 | 0.0018 | 19,55 |
|  | 110 nm | 325K | 0.035 | 0.00095 | 35.84 |
|  | 130 nm | 325K | 0.02 | 0.00085 | 29.76 |
|  | 190 nm | 333K | 0.035 | 0.00065 | 52.84 |
|  | 210 nm | 333K | 0.037 | 0.0006 | 60.66 |

By transferring a transfer layer on a silicon substrate, and then epitaxially forming a target layer on the transfer layer, it is possible to form the target layer as a single crystal even when the lattice mismatch between the silicon substrate and the target layer is large. Since the target layer includes a transition metal oxide such as VO$_2$, it is possible to implement an electronic device having excellent metal-insulator transition properties.

The above description of the embodiments of the present invention provides examples for the description of the present invention. Therefore, the present invention is not limited to the above embodiments, and it is apparent that many modifications and changes may be made, such as by combining the above embodiments by those of ordinary skill in the art within the inventive concept.

What is claimed is:

1. An electronic device comprising:
    a semiconductor substrate;
    a single-crystal first transition metal oxide layer on the semiconductor substrate; and
    a single-crystal second transition metal oxide layer spaced apart from the semiconductor substrate with the single-crystal first transition metal oxide layer interposed therebetween,
    wherein:
    the first and second transition metal oxide layers are in contact with each other;
    the semiconductor substrate, the first transition metal oxide layer, and the second transition metal oxide layer include different materials from each other;
    the first transition metal oxide layer and the second transition metal oxide layer have the same crystal direction;
    the first transition metal oxide layer comprises a rutile-phased TiO$_2$ thin film;
    the second transition metal oxide layer comprises any one selected between a rutile-phased VO$_2$ thin film or a rutile-phased RuO$_2$ thin film;
    the semiconductor substrate has the crystal direction of (100);
    the first transition metal oxide layer and the second transition metal oxide layer have the crystal direction of (001); and
    wherein the second transition metal oxide layer has a thickness of 5 to 10 nm.

2. The electronic device of claim 1, wherein the first transition metal oxide layer and the second transition metal oxide layer each have a different crystal direction from the crystal direction of the semiconductor substrate.

3. The electronic device of claim 1, wherein the semiconductor substrate and the first transition metal oxide layer are in contact with each other.

4. The electronic device of claim 1, further comprising an oxide film interposed between the first transition metal oxide layer and the semiconductor substrate, wherein the first transition metal oxide layer is in contact with the oxide film.

5. The electronic device of claim 4, wherein:
    the semiconductor substrate is a silicon substrate;
    the oxide film is a silicon oxide film; and
    the semiconductor substrate and the oxide film are in contact with each other.

6. The electronic device of claim 1, wherein the lattice mismatch between the second transition metal oxide layer and the semiconductor substrate is 10% or greater.

7. The electronic device of claim 1, wherein the second transition metal oxide layer is etched under weak acid conditions.

8. The electronic device of claim 1, further comprising:
    a gate electrode on the second transition metal oxide layer; and
    a source electrode and a drain electrode spaced apart from each other with the gate electrode interposed therebetween.

9. The electronic device of claim 8, wherein the source electrode and the drain electrode are in contact with the second transition metal oxide layer.

10. The electronic device of claim 8, wherein:
    the source electrode and the drain electrode are spaced apart from the second transition metal oxide layer; and the semiconductor substrate comprises, in an upper portion thereof, a first doped region and a second doped region disposed on both sides with respect to the gate electrode, wherein the source electrode is connected to the first doped region, and the drain electrode is connected to the second doped region.

11. The electronic device of claim 1, further comprising a gate electrode, a first source electrode, a second source electrode, and a drain electrode on the semiconductor substrate, wherein:

the first and second source electrodes are spaced apart from the drain electrode with the gate electrode interposed therebetween; and the semiconductor substrate includes, in an upper portion thereof, a first doping region and a second doping region disposed at both sides with respect to the gate electrode, wherein:

the second transition metal oxide layer is connected in series to the first source electrode and the second source electrode therebetween;

the first source electrode is electrically connected to a ground power source, the second source electrode is electrically connected to the first doped region, and the drain electrode is electrically connected to the second doped region.

* * * * *